(12) United States Patent
Yeh et al.

(10) Patent No.: US 12,368,114 B2
(45) Date of Patent: Jul. 22, 2025

(54) SEMICONDUCTOR DEVICE PACKAGE HAVING WARPAGE CONTROL AND METHOD OF FORMING THE SAME

(71) Applicant: Taiwan Semiconductor Manufacturing Company, Ltd., Hsinchu (TW)

(72) Inventors: Shu-Shen Yeh, Taoyuan (TW); Che-Chia Yang, Taipei (TW); Chia-Kuei Hsu, Hsinchu (TW); Ming-Chih Yew, Hsinchu (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 10 days.

(21) Appl. No.: 18/325,205

(22) Filed: May 30, 2023

(65) Prior Publication Data
US 2023/0299017 A1 Sep. 21, 2023

Related U.S. Application Data

(63) Continuation of application No. 17/318,139, filed on May 12, 2021, now Pat. No. 11,699,668.

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4878* (2013.01); *H01L 23/053* (2013.01); *H01L 23/13* (2013.01)

(58) Field of Classification Search
CPC . H01L 23/562; H01L 21/4878; H01L 23/053; H01L 23/13
(Continued)

(56) References Cited

U.S. PATENT DOCUMENTS

| 6,011,304 A * | 1/2000 | Mertol | H01L 23/04 |
| | | | 257/710 |
| 11,699,668 B2 * | 7/2023 | Yeh | H01L 23/10 |
| | | | 257/618 |

(Continued)

OTHER PUBLICATIONS

Chinese language office action dated Aug. 22, 2022, issued in application No. TW 111105255.

*Primary Examiner* — Quoc D Hoang
(74) *Attorney, Agent, or Firm* — McClure, Qualey & Rodack, LLP

(57) ABSTRACT

A semiconductor device package and a method of forming the same are provided. The semiconductor device package includes a substrate, an electronic component, a ring structure, and an adhesive layer. The electronic component is located over a surface of the substrate. The ring structure is located over the surface of the substrate and surrounding the electronic component. The ring structure has a bottom surface facing the surface of the substrate and a top surface opposite the bottom surface. The ring structure includes recesses recessed from and located on the top surface, wherein the recesses are arranged corresponding to the corners of the substrate. The adhesive layer is interposed between the bottom surface of the ring structure and the surface of the substrate.

20 Claims, 12 Drawing Sheets

(51) Int. Cl.
*H01L 23/053*    (2006.01)
*H01L 23/13*     (2006.01)

(58) Field of Classification Search
USPC .......................................................... 257/618
See application file for complete search history.

(56) References Cited

U.S. PATENT DOCUMENTS

| | | |
|---|---|---|
| 2003/0030140 A1 | 2/2003 | Shim |
| 2004/0150118 A1* | 8/2004 | Honda ................... H01L 23/24 257/E21.503 |
| 2007/0138585 A1 | 6/2007 | Hsin et al. |
| 2014/0151871 A1 | 6/2014 | Refai-Ahmed |
| 2020/0251427 A1 | 8/2020 | Huang et al. |
| 2020/0312789 A1 | 10/2020 | Kim et al. |
| 2022/0013487 A1* | 1/2022 | Kim ........................ H01L 24/97 |

* cited by examiner

SEMICONDUCTOR DEVICE PACKAGE HAVING WARPAGE CONTROL AND METHOD OF FORMING THE SAME

PRIORITY CLAIM AND CROSS-REFERENCE

This application is a Continuation of U.S. application Ser. No. 17/318,139, filed on May 12, 2021, now U.S. Pat. No. 11,699,668, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules (MCM), for example, or in other types of packaging.

One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

Although existing packaging structures and methods for fabricating package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
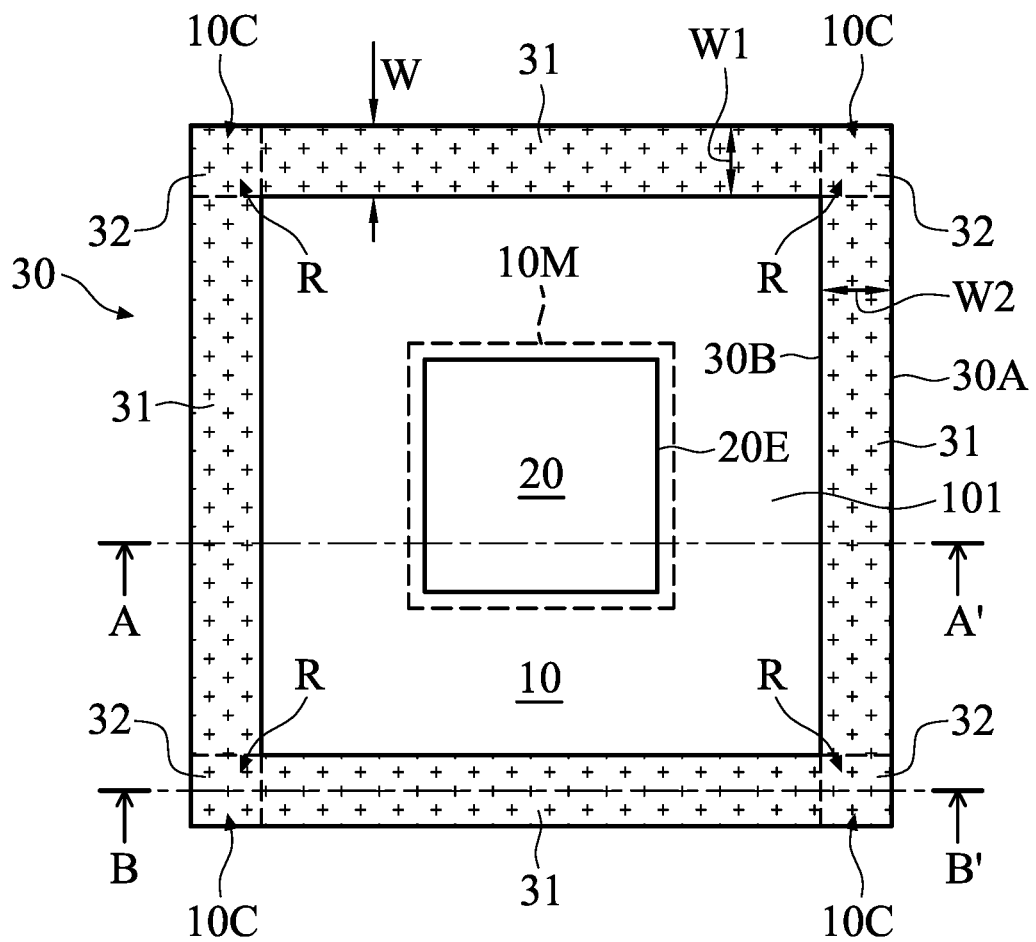
FIG. 1 is a schematic top view of a semiconductor device package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor device package and the method for forming the same are provided in accordance with various embodiments. Some variations of some embodiments are discussed. Throughout the various views and illustrative embodiments, like reference numbers are used to designate like elements. In accordance with some embodiments of the present disclosure, a semiconductor device package includes a ring structure for controlling warpage of a package substrate. The corner parts of the ring structure are thinner than the rest of the ring structure to reduce (mechanical) coupling effect and coefficient of thermal expansion (CTE) mismatch between the corner parts of the ring structure and the corners of the package substrate. Accordingly, the warpage on the package substrate and the entire package is reduced.

Embodiments will be described with respect to a specific context, namely a chip scale package (CSP), particularly flip chip CSP (FcCSP). Other embodiments may also be applied, however, to other packaging techniques, such as flip chip ball grid array (FcBGA) packages and other packaging techniques, such as with an interposer or other active chip in a two and a half dimensional integrated circuit (2.5DIC) structure or a three dimensional IC (3DIC) structure. Although method embodiments may be discussed below as being performed in a particular order, other method embodiments contemplate steps that are performed in any logical order. Further, like reference numbers or indicators refer to like components.

Figure 2A:
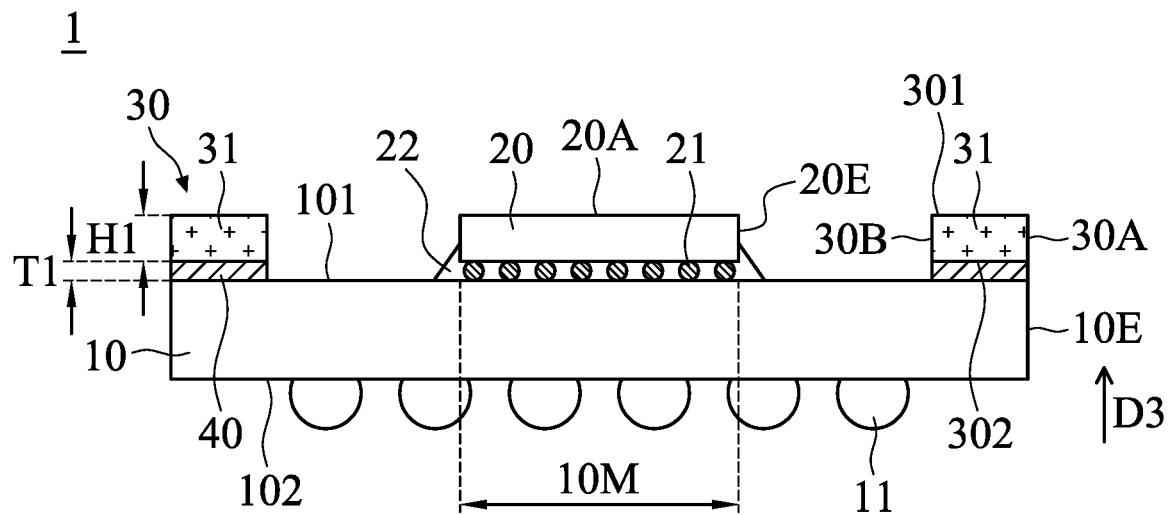
FIG. 2A is a schematic cross-sectional view of the semiconductor device package taken along a line A-A' in FIG. 1, in accordance with some embodiments.
Figure 2B:
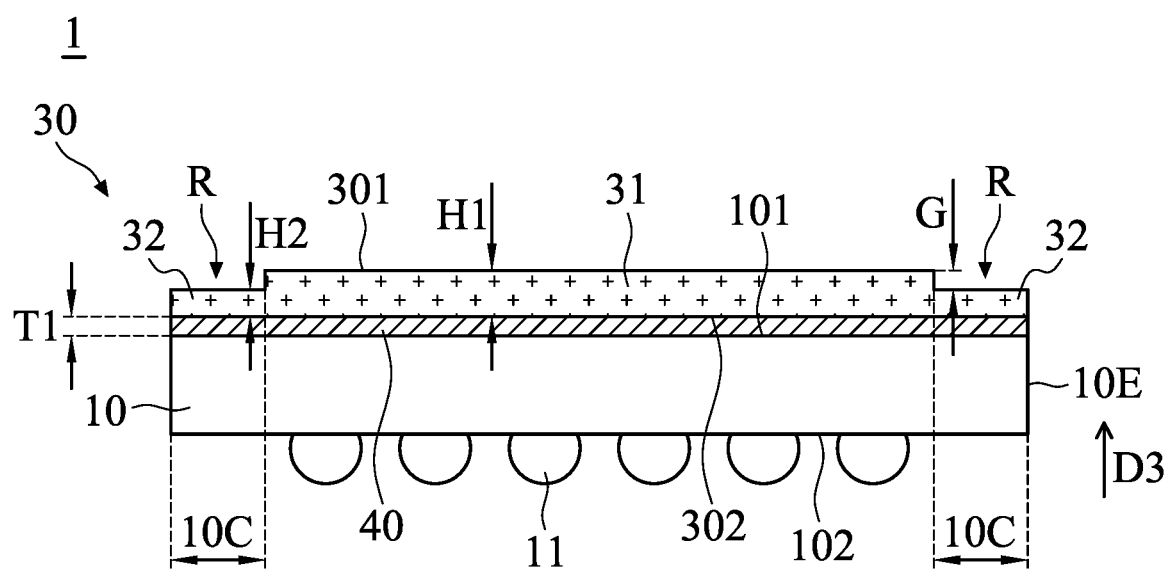
FIG. 2B is a schematic cross-sectional view of the semiconductor device package taken along a line B-B' in FIG. 1, in accordance with some embodiments.

FIG. 1 is a schematic top view of a semiconductor device package 1, in accordance with some embodiments. FIG. 2A is a schematic cross-sectional view of the semiconductor device package 1 taken along a line A-A' in FIG. 1, and FIG. 2B is a schematic cross-sectional view of the semiconductor device package 1 taken along a line B-B' in FIG. 1. As shown in FIG. 1, FIG. 2A and FIG. 2B, the semiconductor device package 1 includes a substrate 10, an electronic component 20, a ring structure 30, and an adhesive layer 40. Additional features can be added to the semiconductor device package 1, and/or some of the features described below can be replaced or eliminated in other embodiments.

The substrate 10 is used to provide electrical connection between semiconductor device(s) (which will be described later) packaged in the semiconductor device package 1 and an external electronic device (not shown). In some embodiments, the substrate 10 is a semiconductor substrate. By way of example, the material of the substrate 10 may include elementary semiconductor such as silicon or germanium; a compound semiconductor such as silicon germanium, silicon carbide, gallium arsenic, gallium phosphide, indium phosphide or indium arsenide; or combinations thereof. In some embodiments, the substrate 10 is a silicon-on-insulator (SOI) substrate, a germanium-on-insulator (GOI) substrate, or the like. In some embodiments, the substrate 10 is an interposer substrate, a package substrate, or the like. The package substrate may include a printed circuit board (PCB), a ceramic substrate, or another suitable package substrate.

In addition, the substrate 10 may have various device elements. Examples of device elements that are formed in or on the substrate 10 may include transistors (e.g., metal oxide semiconductor field effect transistors (MOSFET), complementary metal oxide semiconductor (CMOS) transistors, bipolar junction transistors (BJT), high voltage transistors, high-frequency transistors, p-passage and/or n-passage field-effect transistors (PFETs/NFETs), etc.), diodes, resistors, capacitors, inductors, and/or other applicable device elements. Various processes can be performed to form the device elements, such as deposition, etching, implantation, photolithography, annealing, and/or other suitable processes. The substrate 10 may further have one or more circuit layers used to electrically connect the device elements and the electronic component 20 that is subsequently attached. The substrate 10 generally has a rectangular or square shape in top view (see FIG. 1, FIG. 3A, or FIG. 3B, for example).

The electronic component 20 is disposed over a first surface 101 (e.g., the top surface) of the substrate 10. In some embodiments, the electronic component 20 is a functional integrated circuit (IC) die such as a semiconductor die, and electronic die, a MEMS die, or a combination thereof. The functional IC die may include one or more application processors, logic circuits, memory devices, power management integrated circuits, analog circuits, digital circuits, mixed signal circuits, one or more other suitable functional integrated circuits, or a combination thereof, depending on actual needs. The electronic component 20 can be formed by various processes such as deposition, etching, implantation, photolithography, annealing, and/or other suitable processes.

In some embodiments, as shown in FIG. 1 and FIG. 2A, the electronic component 20 is mounted on a die mounting region 10M of the substrate 10 through flip-chip bonding. For example, the electronic component 20 is bonded onto the contact pads (not shown for simplicity) exposed at the first surface 101 of the substrate 10 via electrical connectors 21. The electrical connectors 21 are used for electrically interconnecting the electronic component 20 with the substrate 10. The electrical connectors 21 may include conductive pillars, solder balls, controlled collapse chip connection (C4) bumps, micro bumps, one or more other suitable bonding structures, or a combination thereof.

In some embodiments, the electrical connectors 21 may be made of or include a metal material, such as copper, aluminum, gold, nickel, silver, palladium, or the like, or a combination thereof. The electrical connectors 21 may be formed using an electroplating process, an electroless plating process, a placement process, a printing process, a physical vapor deposition (PVD) process, a chemical vapor deposition (CVD) process, a photolithography process, one or more other applicable processes, or a combination thereof.

In some other embodiments, the electrical connectors 21 may be made of a tin-containing material. The tin-containing material may further include copper, silver, gold, aluminum, lead, one or more other suitable materials, or a combination thereof. In some other embodiments, the electrical connectors 21 are lead-free. A reflow process may be performed in order to shape the tin-containing material into the desired bump or ball shapes.

In some embodiments, an underfill layer 22 is further formed to surround and protect the electrical connectors 21, and enhances the connection between the electronic component 20 and the substrate 10, as shown in FIG. 2A. The underfill layer 22 may be made of or include an insulating material such as an underfill material. The underfill material may include an epoxy, a resin, a filler material, a stress release agent (SRA), an adhesion promoter, another suitable material, or a combination thereof.

In some embodiments, an underfill material in liquid state is dispensed into a gap between the electronic component 20 and the substrate 10 to reinforce the strength of the electrical connectors 21 and therefore the overall package structure. After the dispensing, the underfill material is cured to form the underfill layer 22. In the embodiments shown in FIG. 2A, the underfill layer 22 fills the whole gap between the electronic component 20 and the substrate 10, and covers all the lower surface of the electronic component 20. In some other embodiments, the underfill layer 22 is not formed, or merely covers portions of the lower surface of the electronic component 20.

As shown in FIG. 2A, the semiconductor device package 1 may further include electrical connectors 11 over a second surface 102 (e.g., the bottom surface) of the substrate 10, in accordance with some embodiments. The electrical connectors 11 may be electrically connected to the electrical connectors 21 through the circuit layer(s) of the substrate 10. The electrical connectors 11 enable electrical connection between the semiconductor device package 1 and an external electronic device such as a PCB (not shown). The electrical connectors 11 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls are disposed on the contact pads (not shown for simplicity) exposed at the second surface 102 of the substrate 10. A reflow process is then carried out to melt the solder balls into the solder bumps (e.g., electrical connectors 11). In some other embodiments, under bump metallization (UBM) elements are formed over the exposed contact pads before the solder balls are disposed. In some other embodiments, solder elements are electroplated onto the exposed contact pads. Afterwards, a reflow process is used to melt the solder element to form the solder bumps (e.g., electrical connectors 11).

The ring structure 30 is disposed over the first surface 101 of the substrate 10, and is adjacent to edges 20E of the electronic component 20 and surrounding the electronic component 20. The ring structure 30 generally has a rectangular or square ring shape in top view, depending on the shape of the substrate 10. In some embodiments, an inner edge 30B of the ring structure 30 is adjacent to the edges 20E of the electronic component 20, and an outer edge 30A of the ring structure 30 is substantially aligned with an edge 10E of the substrate 10 (i.e., the ring structure 30 having substantially the same dimensions as the substrate 10). The ring structure 30 is basically a flat structure, and has a bottom surface 302 facing the surface 101 of the substrate 10 and a top surface 301 opposite the bottom surface 302. The ring structure 30 is configured as a stiffener ring, and is used to constrain the substrate 10 to alleviate its warpage and/or to enhance robustness of the substrate 10. In some embodiments, the material of the ring structure 30 may include metal such as copper, stainless steel, stainless steel/Ni, or the like, but is not limited thereto.

The adhesive layer 40 is interposed between the first surface 101 of the substrate 10 and the bottom surface 302 of the ring structure 30. The adhesive layer 40 is configured to bond the ring structure 30 to the substrate 10. In some embodiments, the adhesive layer 40 is applied to the periphery of the first surface 101 of the substrate 10. The periphery of the first surface 101 and the bottom surface 302 of the ring structure 30 are substantially flat, so that the adhesive layer 40 therebetween has a consistent thickness T1, as shown in FIG. 2A and FIG. 2B. In some embodiments, the material of the adhesive layer 40 is more flexible and softer than that of the substrate 10 and the ring structure 30. Examples of the material for the adhesive layer 40 may include organic adhesive material such as epoxy, polyimide (PI), polybenzoxazole (PBO), benzo-cyclo-butene (BCB), but are not limited thereto.

It should be understood that the above-mentioned various components and substrate materials used in the semiconductor device package 1 may have different coefficient of thermal expansions (CTEs). Hence, when the package undergoes thermal cycling during package assembly, reliability testing, or field operation, the components and substrate materials may expand at different rates, causing the substrate 10 tends to warp, the substrate 10 typically bowing into a convex shape. The ring structure 30 may reduce some extent this warpage, but since the ring structure 30 constrains the substrate 10, this constraining force produces stress in the substrate 10. The stress is typically concentrated at the corners of the substrate 10, so the substrate 10 may still suffer a certain degree of warpage at the corners.

What is needed is a semiconductor device package having a ring structure that addresses the issue of stress concentration at the corners of the substrate and warpage occurring at the corners of the substrate. Embodiments of the semiconductor device package solve the above issue by using a ring structure that only has corner parts thinner than other parts of the ring structure (which will be described later) to reduce (mechanical) coupling effect, as well as CTE mismatch, between the corner parts of the ring structure and the corners of the substrate, thereby reducing stress concentration at the corners of the substrate.

As shown in FIG. 1, FIG. 2A and FIG. 2B, the ring structure 30 of the semiconductor device package 1 includes a first part having a first height H1 (in a vertical direction D3), and a second part recessed from the top surface 301 of the ring structure 30 and having a second height H2 (in the vertical direction D3) that is lower than the first height H1, in accordance with some embodiments. In some embodiments, the first part of the ring structure 30 includes four segmented side parts 31 substantially corresponding to four sides of the substrate 10, respectively. The second part of the ring structure 30 includes four segmented corner parts 32 substantially corresponding to four corners 10C of the substrate 10, respectively. Any two of the corner parts 32 are separated from one another by one side part 31, and any two of the side parts 31 are separated from one another by one corner part 32. The side parts 31 and corner parts 32 are connected together to form the ring structure 30.

In some embodiments, the substrate 10 has a square shape, and the ring structure 30 has a square ring shape accordingly, as shown in FIG. 1. In this case, the ring structure 30 has a uniform width W in top view, and each corner part 32 has a square shape with the same lateral edge widths in two orthogonal directions D1, D2 (i.e., W1=W2). However, embodiments of the disclosure are not limited to square substrate and square ring structure (which will be further described later).

In some embodiments, the second height H2 (of the corner parts 32) is less than about ¾ of the first height H1

(of the side parts 31) and greater than about ¼ of the first height H1, to achieve better warpage control performance using the ring structure 30. For example, the first height H1 is about 500 μm, and the second height H2 is about 125 μm to about 375 μm in some cases, but the disclosure is not limited thereto. If the second height H2 is greater than ¾ of the first height H1, the entire ring structure 30 will have almost the same height and cannot avoid stress concentration at the corners 10C of the substrate 10. On the other hand, if the second height H2 is less than ¼ of the first height H1, the ring structure 30 cannot effectively suppress the warpage of the substrate 10 (such as at the corners 10C).

As shown in FIG. 2B, due to the different heights of the side parts 31 and the corner parts 32 of the ring structure 30, there is a vertical gap G (e.g., G=H1-H2) between the top surface of each side part 31 and the top surface of one adjacent corner part 32, in accordance with some embodiments. As a result, a pair of adjacent corner part 32 and side part 31 form a stepped profile. A recess R is formed between the top surface of each corner part 32 and a lateral surface of one adjacent side part 31. In the embodiments shown in FIG. 1, FIG. 2A and FIG. 2B, there are four recesses R formed at the corner parts 32 of the ring structure 30. The recesses R (or the recessed corner parts 32) can be formed in the ring structure 30 using a mechanical process such as a punching process, a chemical process such as an etching process, laser ablation, or the like. In some embodiments, each corner part 32 is immediately adjacent to the outer edge 30A of the ring structure 30, and the recesses R at the corner parts 32 are open to the outer edge 30A, as shown in FIG. 1 and FIG. 2B, but embodiments of the disclosure are limited thereto (which will be further described later).

With the above design (i.e., the corner parts 32 of the ring structure 30 are thinner than the rest of the ring structure 30), coupling effect and CTE mismatch between the corner parts 32 of the ring structure 30 and the corners 10C of the substrate 10 can be reduced. Consequently, the ring structure 30 lowers the stress (induced by constraints of the ring structure 30 on the substrate 10) concentrated at the corners 10C of the substrate 10 and also reduces package warpage. As a result, the semiconductor device package may be more reliably used and/or more reliably connected to an external electronic device such as a PCB.

The semiconductor device package and the ring structure of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3A:
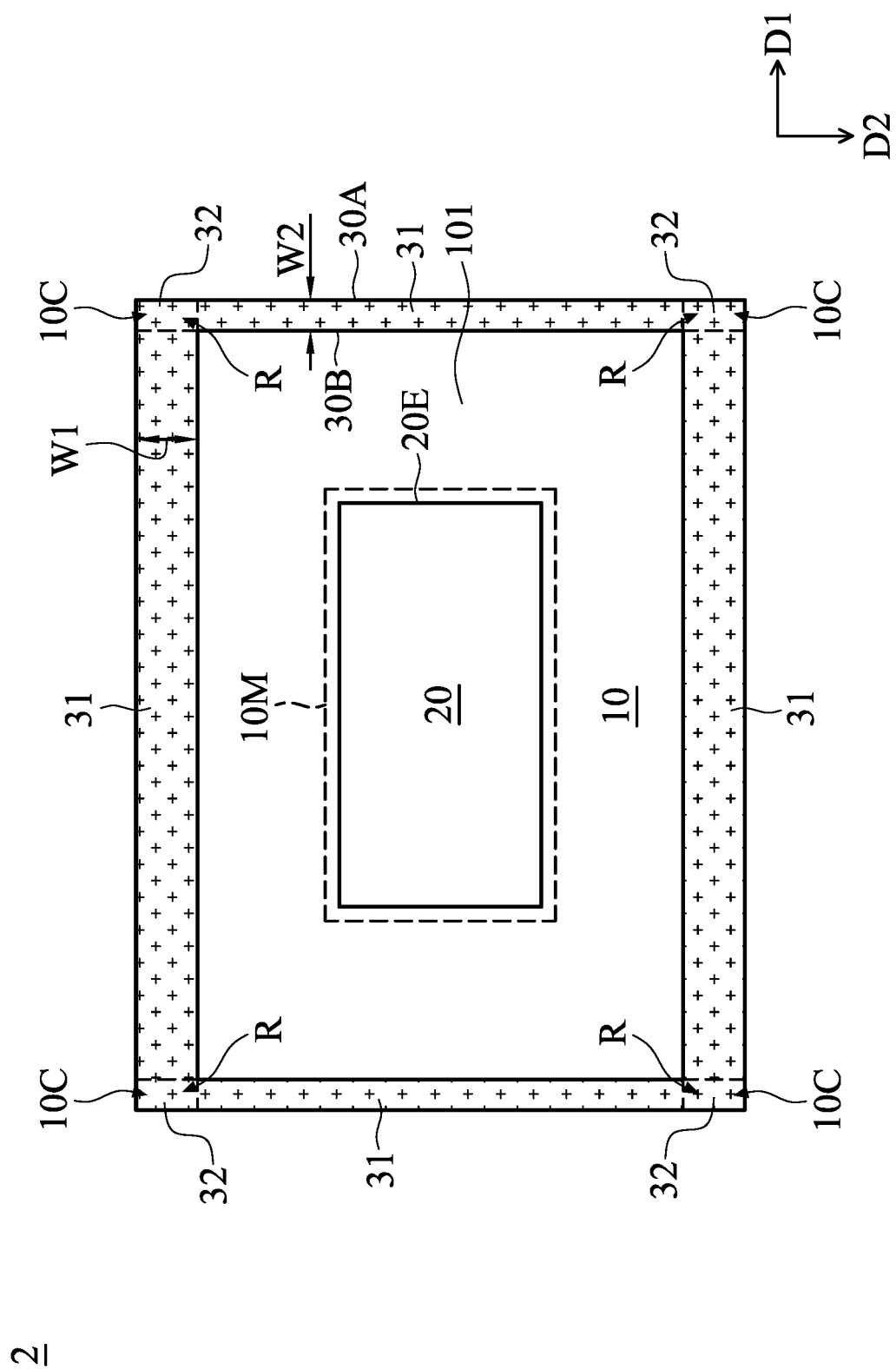
FIG. 3A is a schematic top view of a semiconductor device package, in accordance with some embodiments.

FIG. 3A illustrates a schematic top view of a semiconductor device package 2 including a substrate 10 of rectangular shape and a ring structure 30 of rectangular ring shape (the long axis being in the direction D1), in accordance with some embodiments. In this case, the side parts 31 of the ring structure 30 arranged in the direction D1 (long axis direction) are wider than the side parts 31 of the ring structure 30 arranged in the direction D2 (short axis direction) for better structural strength. Each recessed corner part 32 accordingly has a rectangular shape with the lateral edges in the direction D2 being wider than the lateral edges in the direction D1 (i.e., W1>W2).

Figure 3B:
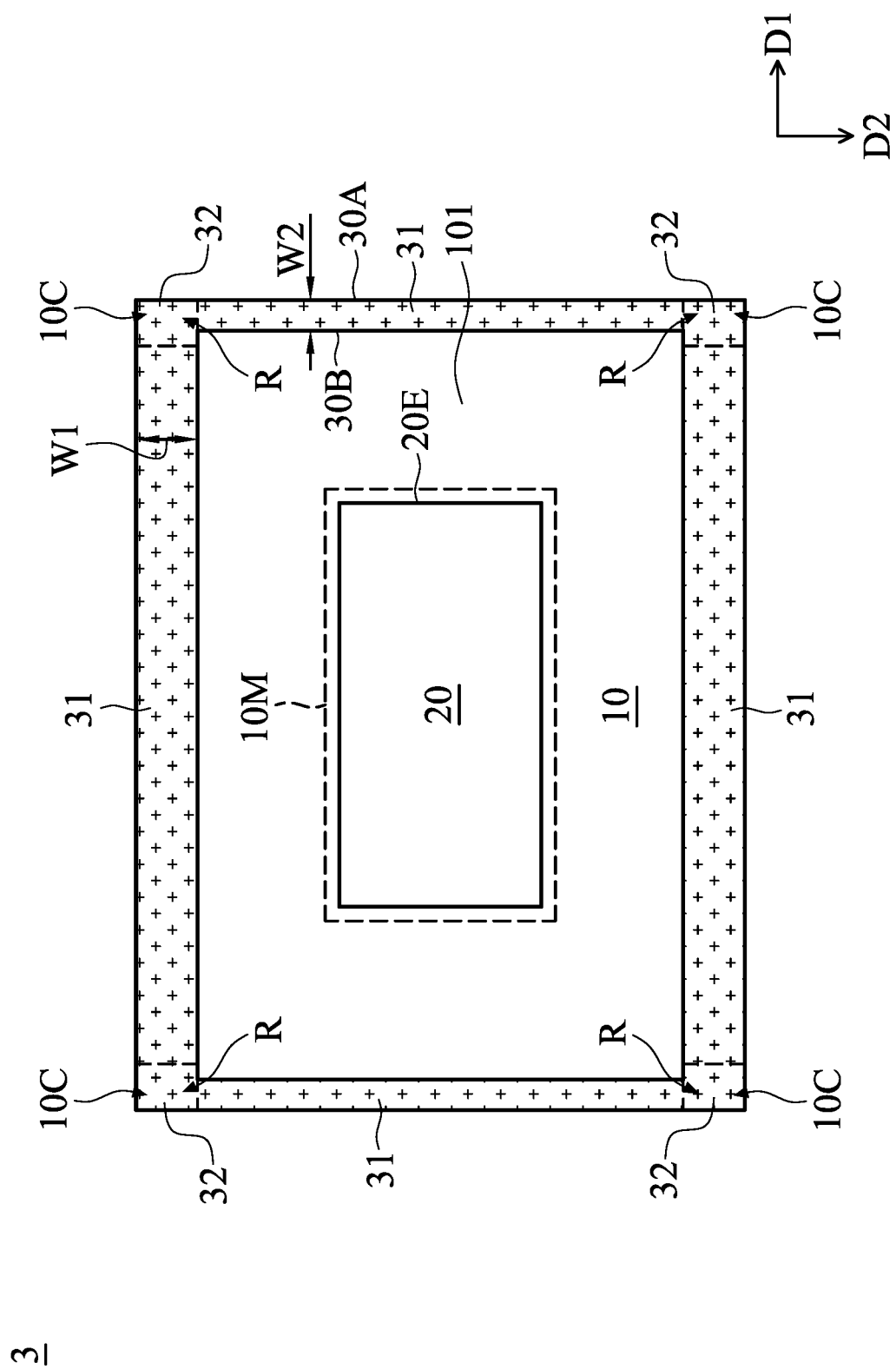
FIG. 3B is a schematic top view of a semiconductor device package, in accordance with some embodiments.

FIG. 3B illustrates a schematic top view of a semiconductor device package 3, in accordance with some embodiments. The semiconductor device package 3 differs from the semiconductor device package 2 of FIG. 3A in that each recessed corner part 32 has a rectangular shape with one connecting lateral edge of the recessed corner part 32 is aligned with the outer side wall of one side part 31, and the opposing lateral edge of the recessed corner part 32 is offset from the inner side wall of the side part 31.

Figure 4A:
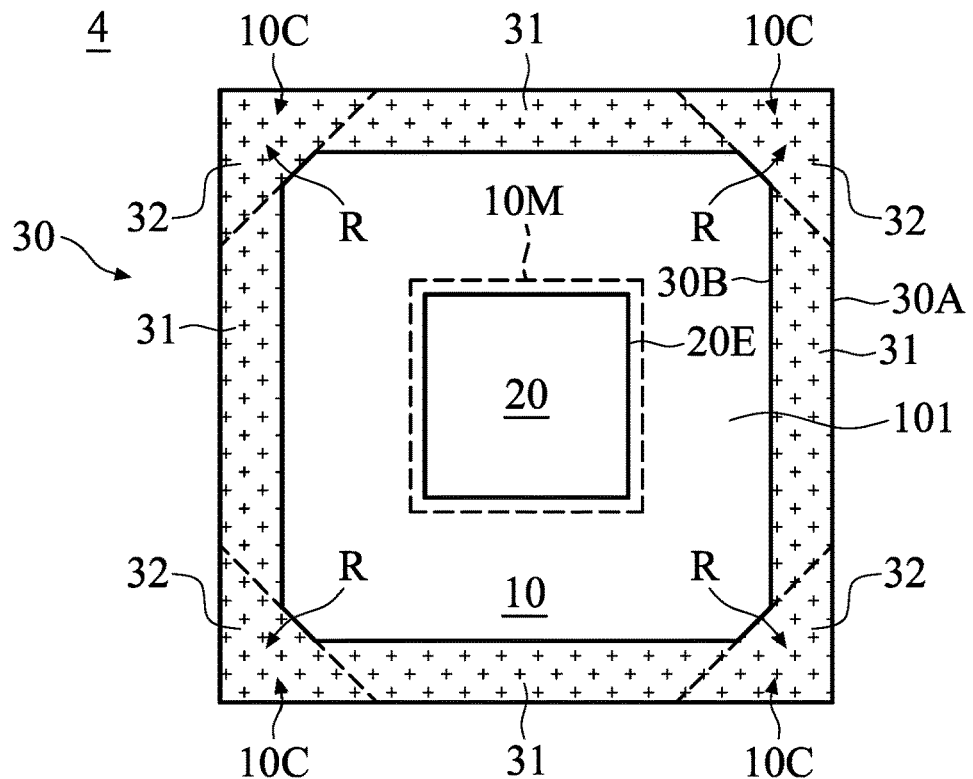
FIG. 4A is a schematic top view of a semiconductor device package, in accordance with some embodiments.
Figure 4B:
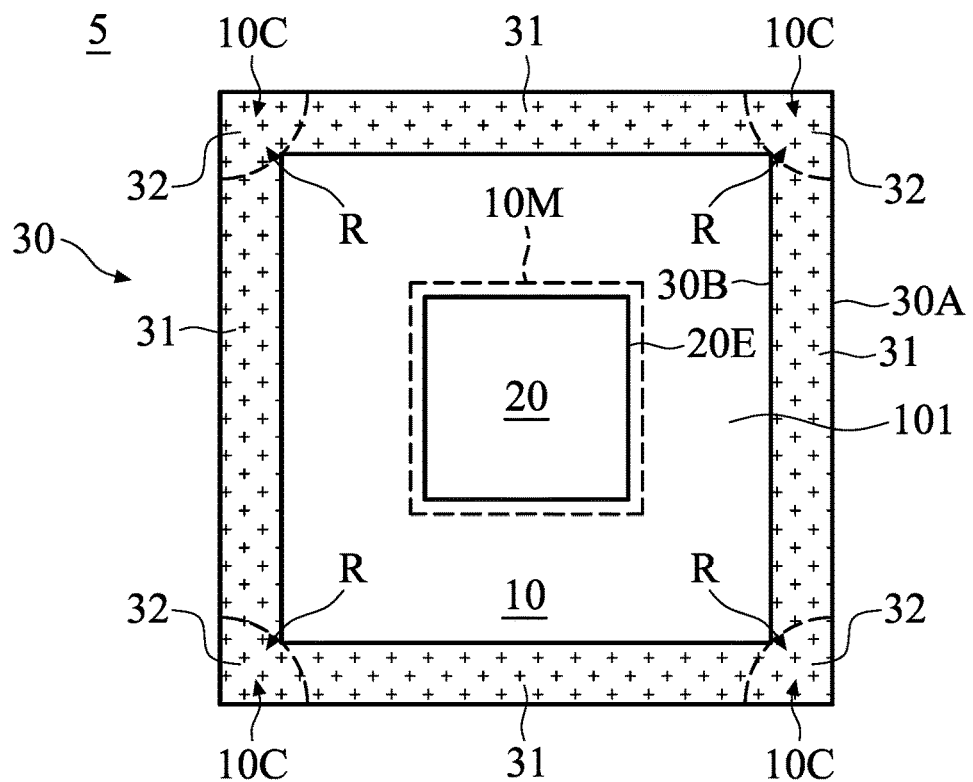
FIG. 4B is a schematic top view of a semiconductor device package, in accordance with some embodiments.
Figure 4C:
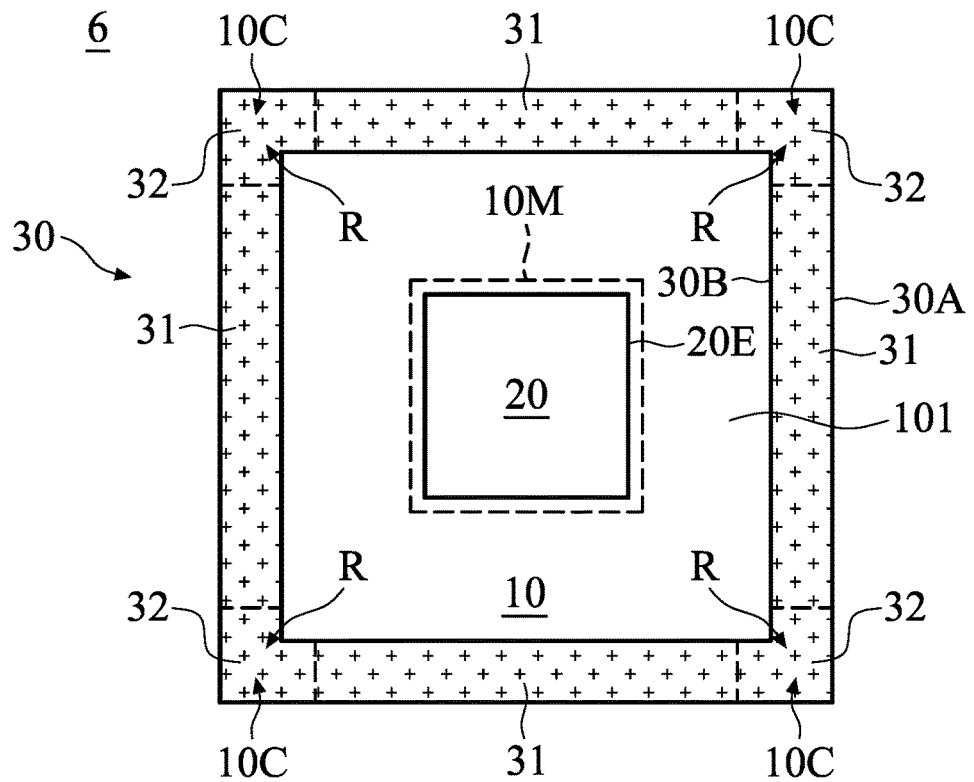
FIG. 4C is a schematic top view of a semiconductor device package, in accordance with some embodiments.

FIG. 4A is a schematic top view of a semiconductor device package 4, in accordance with some embodiments. As depicted in FIG. 4A, each corner part 32 (and the formed recess R) of the ring structure 30 may include a triangular shape in top view. FIG. 4B is a schematic top view of a semiconductor device package 5, in accordance with some embodiments. As depicted in FIG. 4B, each corner part 32 (and the formed recess R) of the ring structure 30 may include a quarter circle shape in top view. FIG. 4C is a schematic top view of a semiconductor device package 6, in accordance with some embodiments. As depicted in FIG. 4C, each corner part 32 (and the formed recess R) of the ring structure 30 may include an L shape in top view. In FIG. 4A to FIG. 4C, the corner parts 32 and the recesses R are immediately adjacent to the outer edge 30A of the ring structure 30.

Figure 4D:
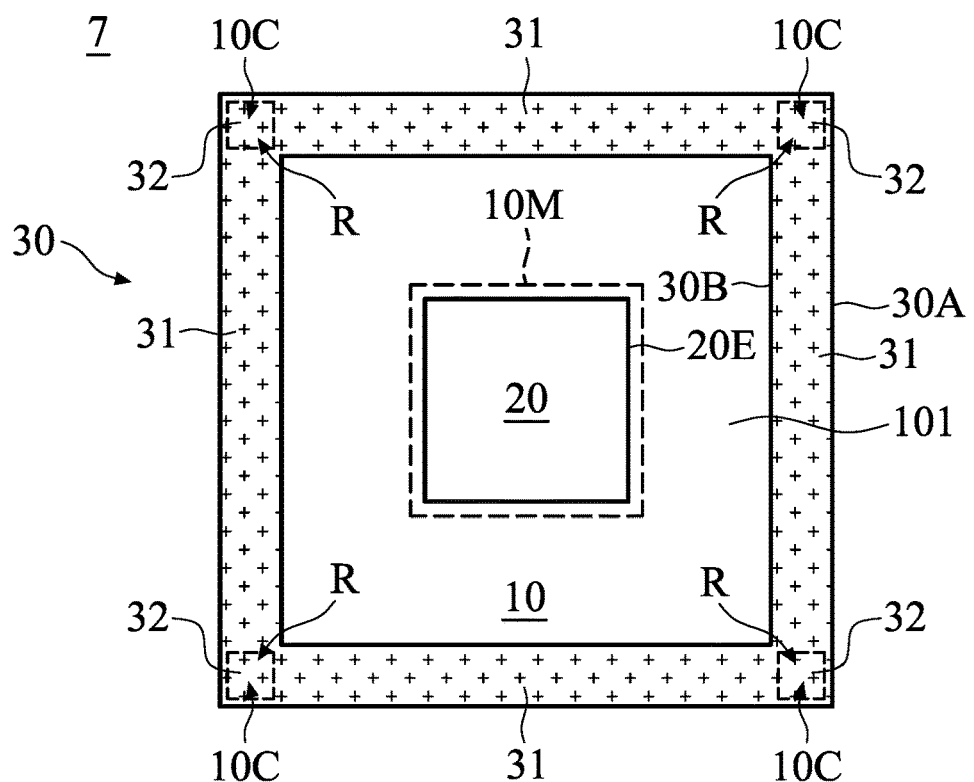
FIG. 4D is a schematic top view of a semiconductor device package, in accordance with some embodiments.
Figure 4E:
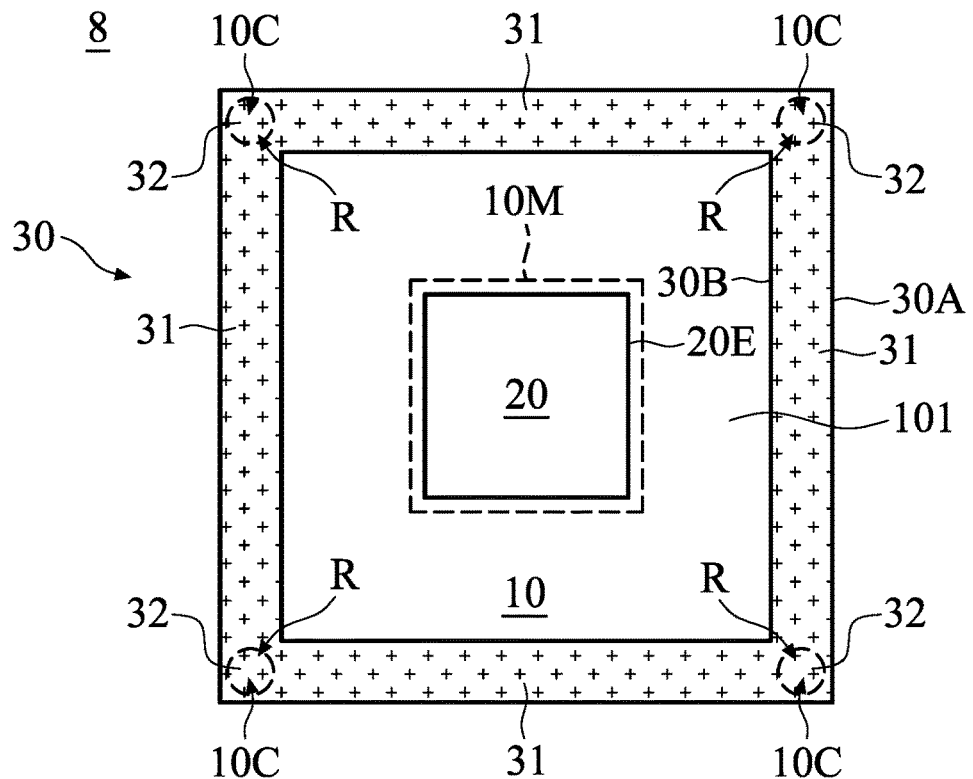
FIG. 4E is a schematic top view of a semiconductor device package, in accordance with some embodiments.
Figure 4F:
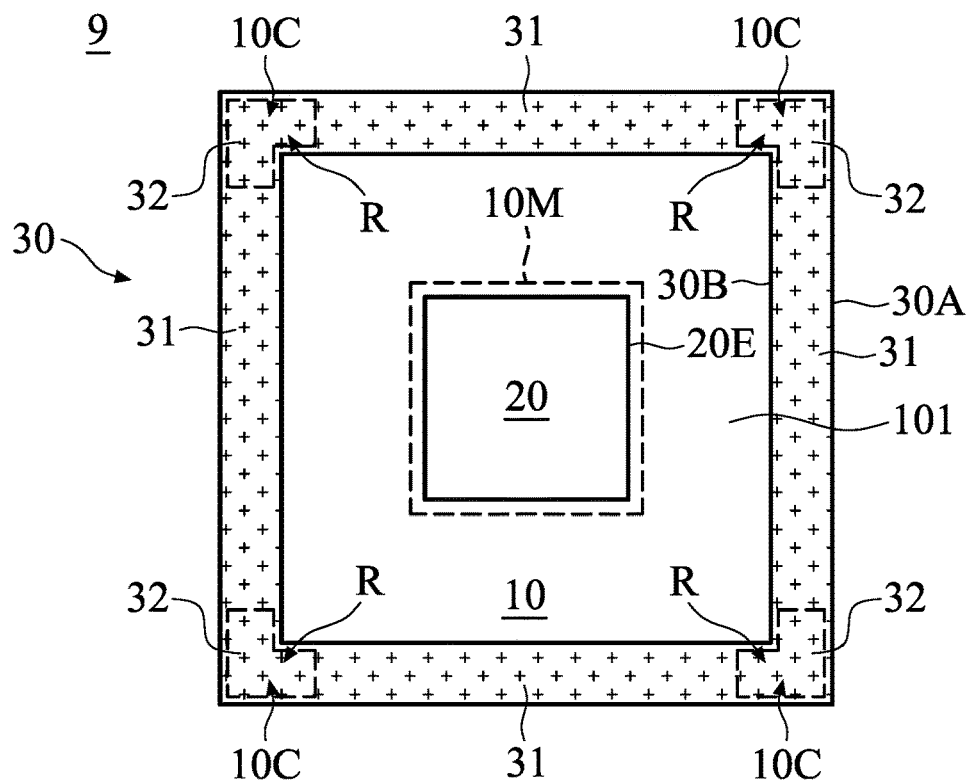
FIG. 4F is a schematic top view of a semiconductor device package, in accordance with some embodiments.

FIG. 4D is a schematic top view of a semiconductor device package 7, in accordance with some embodiments. As depicted in FIG. 4D, each corner part 32 (and the formed recess R) of the ring structure 30 may include a rectangular shape in top view, and is separated from the outer edge 30A of the ring structure 30 by the side parts 31. FIG. 4E is a schematic top view of a semiconductor device package 8, in accordance with some embodiments. As depicted in FIG. 4E, each corner part 32 (and the formed recess R) of the ring structure 30 may include a circular shape in top view, and is separated from the outer edge 30A of the ring structure 30 by the side parts 31. FIG. 4F is a schematic top view of a semiconductor device package 9, in accordance with some embodiments. As depicted in FIG. 4F, each corner part 32 (and the formed recess R) of the ring structure 30 may include a L shape in top view, and is separated from the outer edge 30A of the ring structure 30 by the side parts 31. In FIG. 4D to FIG. 4F, the side parts 31 of the ring structure 30 are connected together (i.e., any two of the side parts 31 are not separated from one another by one corner part 32).

Figure 5A:
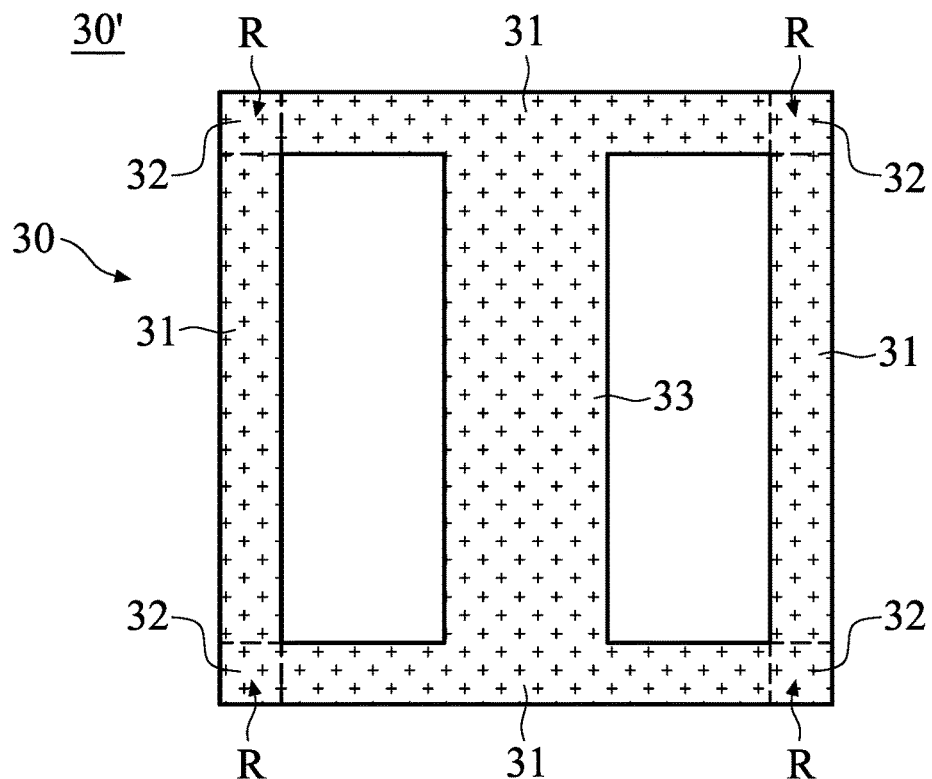
FIG. 5A is a schematic top view of a ring structure, in accordance with some embodiments.

FIG. 5A is a schematic top view of a ring structure 30', in accordance with some embodiments. As depicted in FIG. 5A, the ring structure 30' further includes a strengthening part 33 (also referred to as "central lid part") extending between opposite side parts 31. The strengthening part 33 may be integrally formed with the side parts 31 and the corner parts 32 of the ring structure 30'. The strengthening part 33 is used to increase the structural strength of the ring structure 30'. In some embodiments, the strengthening part 33 may be spaced apart from or in contact with an upper surface 20A of the electronic component 20 (see FIG. 2A) to protect the electronic component 20 and/or help dissipate heat from the electronic component 20.

Figure 5B:
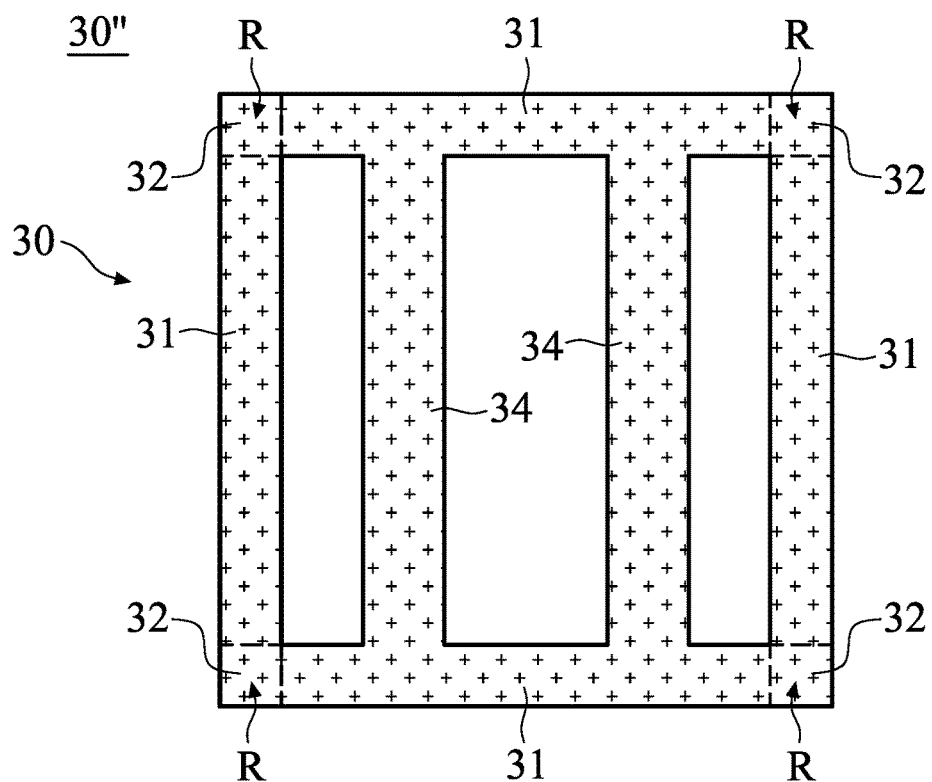
FIG. 5B is a schematic top view of a ring structure, in accordance with some embodiments.

FIG. 5B is a schematic top view of a ring structure 30", in accordance with some embodiments. As depicted in FIG. 5B, the ring structure 30" further includes two strengthening parts 34 (also referred to as "rib parts") extending between opposite side parts 31. The strengthening parts 34 may be integrally formed with the side parts 31 and the corner parts 32 of the ring structure 30". The strengthening parts 34 are used to increase the structural strength of the ring structure 30". In some embodiments, the strengthening parts 34 may be located on opposite sides of the electronic component 20 in top view (see FIG. 1), and each strengthening part 34 may be spaced apart from or in contact with an upper surface 20A of the electronic component 20 (see FIG. 2A) to protect the electronic component 20 and/or help dissipate heat from the electronic component 20. The number of the strengthening parts 34 may be more than two in some other embodiments.

Figure 5C:
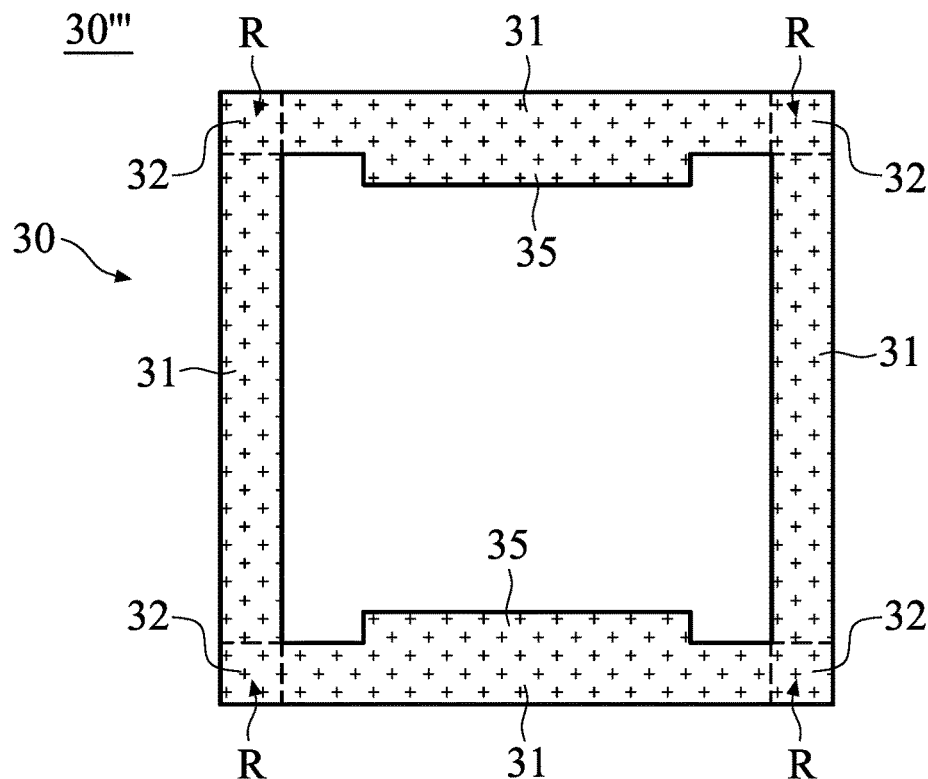
FIG. 5C is a schematic top view of a ring structure, in accordance with some embodiments.

FIG. 5C is a schematic top view of a ring structure 30''', in accordance with some embodiments. As depicted in FIG. 5C, the ring structure 30'' further includes two strengthening parts 35 (also referred to as "protrusions") protruding from opposite side parts 31, respectively. The strengthening parts 35 may be integrally formed with the side parts 31 and the corner parts 32 of the ring structure 30'''. The strengthening parts 35 are used to increase the structural strength of the ring structure 30'''. In some embodiments, the strengthening parts 35 may be disposed on opposite sides of the electronic component 20 in top view (see FIG. 1). In some embodiments, the strengthening parts 35 may have the same height (in the vertical direction D3 shown in FIG. 2A and FIG. 2B) as that of the side parts 31.

The above strengthening parts 33, 34 and/or 35 may be applied to the ring structure of any of the semiconductor device packages as disclosed in the aforementioned embodiments of FIGS. 1 to 4.

Figure 6:
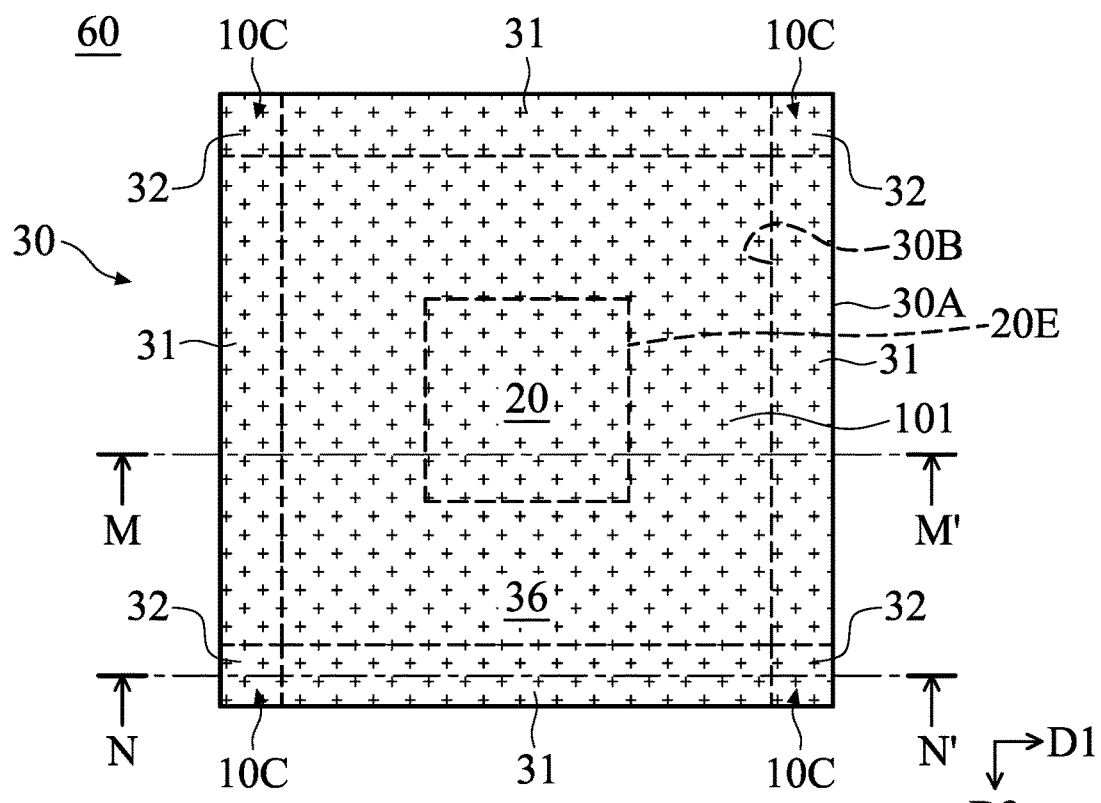
FIG. 6 is a schematic top view of a semiconductor device package, in accordance with some embodiments.
Figure 7A:
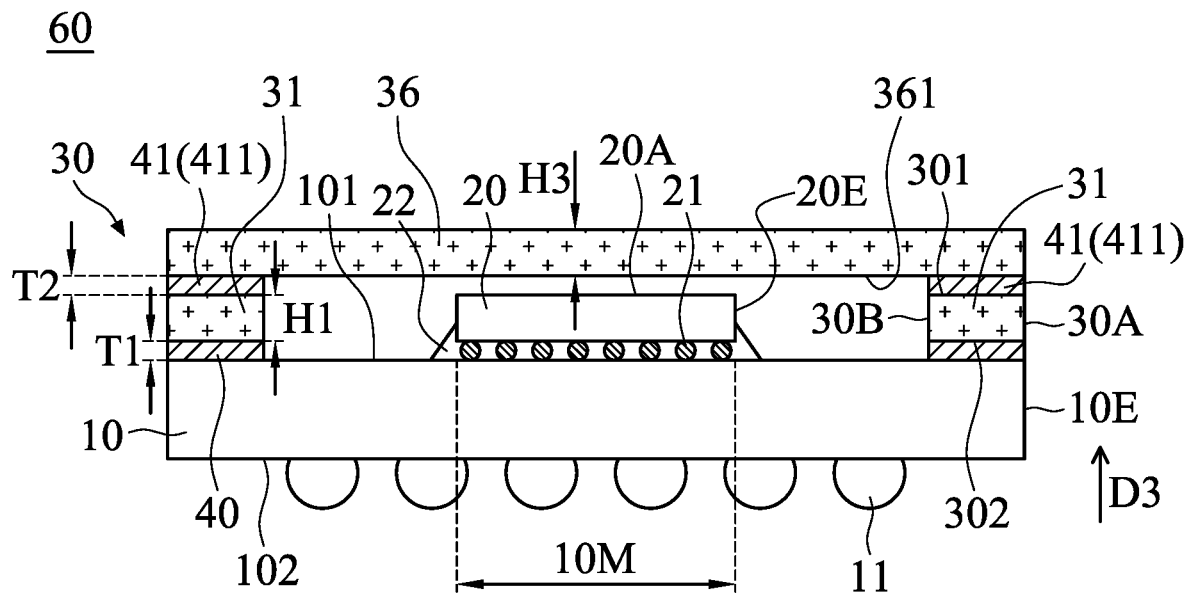
FIG. 7A is a schematic cross-sectional view of the semiconductor device package taken along a line M-M' in FIG. 6, in accordance with some embodiments.
Figure 7B:
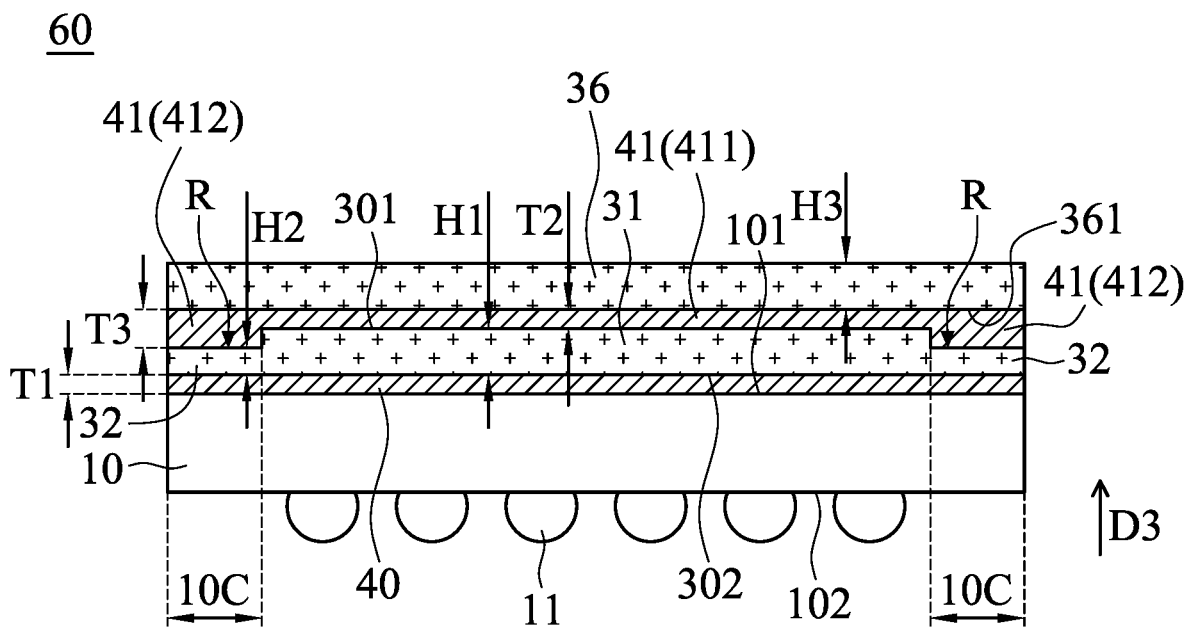
FIG. 7B is a schematic cross-sectional view of the semiconductor device package taken along a line N-N' in FIG. 6, in accordance with some embodiments.

FIG. 6 is a schematic top view of a semiconductor device package 60, in accordance with some embodiments. FIG. 7A is a schematic cross-sectional view of the semiconductor device package 60 taken along a line M-M' in FIG. 6, and FIG. 7B is a schematic cross-sectional view of the semiconductor device package taken along a line N-N' in FIG. 6. As shown in FIG. 6, FIG. 7A and FIG. 7B, the semiconductor device package 60 further includes a lid structure 36 over the top surface 301 of the ring structure 30, and a second adhesive layer 41 interposed between the top surface 301 of the ring structure 30 and a bottom surface 361 of the lid structure 36. In some embodiments, the lid structure 36 has a uniform height H3 in the vertical direction D3. The lid structure 36 is connected to the side parts 31 and the corner parts 32 of the ring structure 30 via the second adhesive layer 41, and the lid structure 36 and the ring structure 30 may be configured as a shielding element for sealing the electronic component 20 on the substrate 10. In some embodiments, the lid structure 36 may be spaced apart from or in contact with an upper surface 20A of the electronic component 20 to protect the electronic component 20 and/or help dissipate heat from the electronic component 20. In some embodiments, the lid structure 36 may be formed of the same material as the ring structure 30. In some embodiments, the second adhesive layer 41 may be formed of the same material as the adhesive layer 40.

As shown in FIG. 7A and FIG. 7B, the second adhesive layer 41 has a first portion 411 substantially over and aligned with the first part (i.e., the side parts 31) of the ring structure 30, and a second portion 412 substantially over and aligned with the second part (i.e., the corner parts 32) of the ring structure 30. In some embodiment, the first portion 411 has a first thickness T2, and the second portion 412 has a second thickness T3 larger than the first thickness T2. In some embodiments, the second portion 412 of the second adhesive layer 41 includes segmented portions (separated from the first portion 411) substantially corresponding to the respective corners 10C of the substrate 10. In some embodiments, the segmented portions of the second portion 412 are protruded toward the corner parts 32 of the ring structure 30 (e.g., extending into the recesses R at the corner parts 32), and thus have the second thickness T3 larger than the first thickness T2 of the first portion 411. In some embodiments, the recessed corner parts 32 enlarge the contact area between the ring structure 30 and the second adhesive layer 41, and thus increases adhesion between them (as well as the lid structure 36). The semiconductor device package 60 can therefore be more reliably used. In some embodiments, the shape of the segmented portions of the second portion 412 of the second adhesive layer 41 correspond to the shape of the corner parts 32 (or the recesses R) of the ring structure 30 in top view. The lid structure 36 may be applied to the ring structures of any of the semiconductor device packages as disclosed in the aforementioned embodiments of FIGS. 1 to 5.

Figure 8:
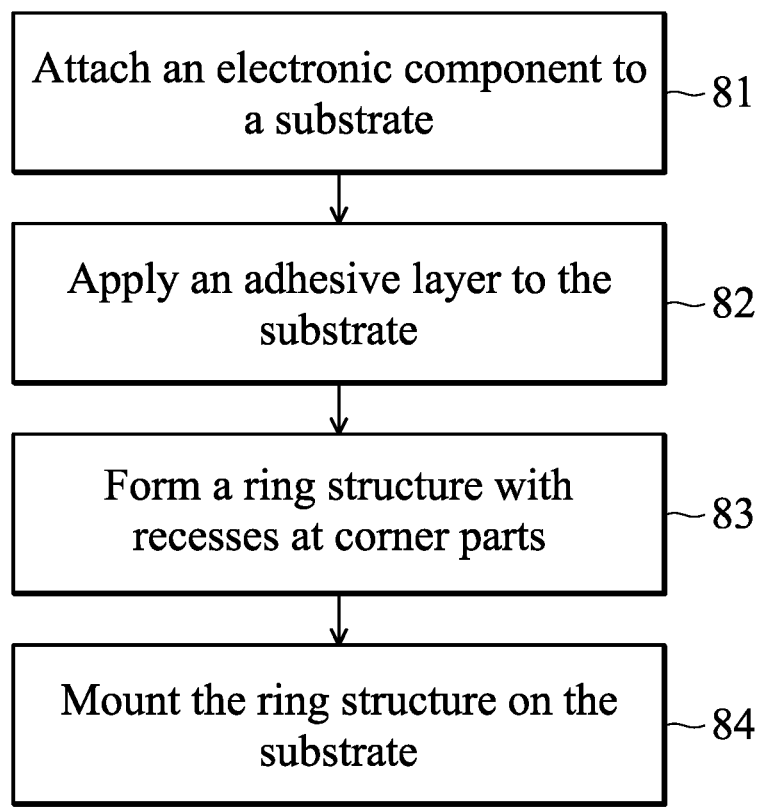
FIG. 8 is a flow chart illustrating a method for fabricating a semiconductor device package, in accordance with some embodiments.

FIG. 8 is a flow chart illustrating a method for fabricating a semiconductor device package, in accordance with some embodiments. In operation 81, an electronic component 20 is attached to a substrate 10, such as by using a pick-and-place tool to place the electronic component 20 on a first surface 101 of the substrate 10. Afterwards, electrical connectors 21 between the electronic component 20 and the substrate 10 are reflowed as previously discussed in FIG. 2A, to electrically interconnect the electronic component 20 with the substrate 10. In operation 82, an adhesive layer 40 is applied, for example, by dispensing the adhesive layer 40 on the periphery of the first surface 101 of the substrate 10 as previously discussed in FIG. 2A and FIG. 2B. In operation 83, recesses R are formed in a ring structure 30 (or 30', 30'', 30''') using, for example, a punching process, another mechanical process, a chemical etching process, a laser ablation process, or another applicable process. The recesses R are formed on the top surface 301 of the ring structure 30 and corresponding to or at the corner parts of the top surface 301 of the ring structure 30, so that the corner parts 32 of the ring structure 30 are thinner than the rest of the ring structure 30. The recesses R (or the recessed corner parts 32) can be any of the recesses (or the recessed corner parts) previously discussed in FIGS. 1 to 7 or the like. In operation 84, the ring structure 30 (or 30', 30'', 30''') with only thinner corner parts 32 is applied to the first surface 101 of the substrate 10, for example, by using a pick-and-place tool to mount ring structure 30 on the periphery of the first surface 101 of the substrate 10 via the adhesive layer 40, as shown in the embodiments described above. In some embodiments, the method for fabricating a semiconductor device package further includes attaching a lid structure 36 over the top surface 301 of the ring structure 30 (or 30', 30', 30''') via a second adhesive layer 41, as discussed previously in FIGS. 6 to 7. A portion of the second adhesive layer 41 may extend into the recesses R formed in the ring structure 30, and thus increases adhesion.

Figure 9:
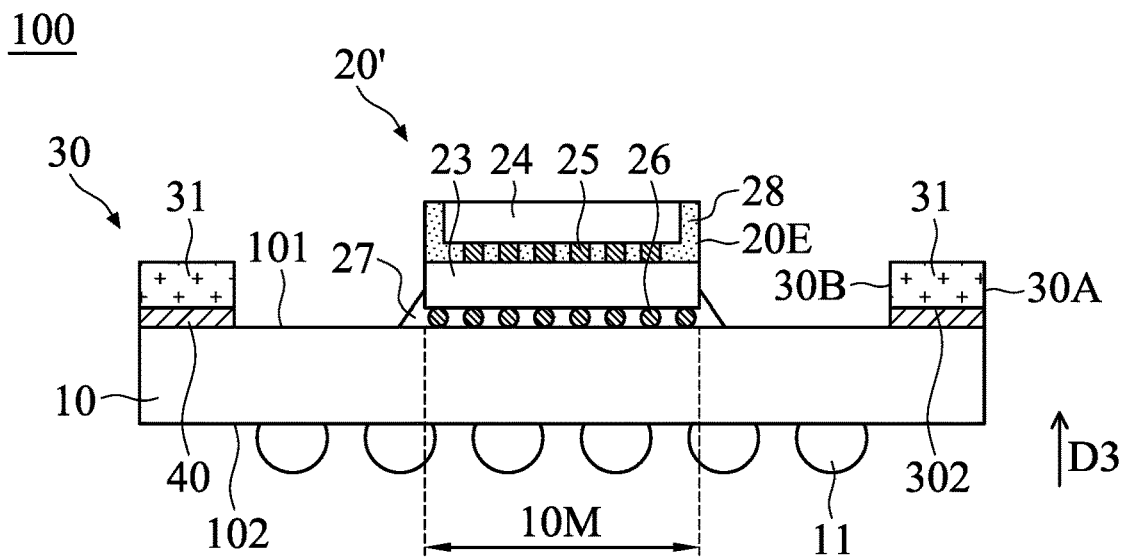
FIG. 9 is a schematic cross-sectional view of a semiconductor device package, in accordance with some embodiments.

FIG. 9 is a schematic cross-sectional view of a semiconductor device package 100, in accordance with some embodiments. The semiconductor device package 100 is similar to the semiconductor device package 1 shown in FIGS. 1 to 2, except that an electronic component 20' is used to replace the electronic component 20 of the semiconductor device package 1. As shown in FIG. 9, the semiconductor device package 100 may include a package such as a 2.5D or 3D IC package structure. In some embodiments, the semiconductor device package 100 may include a chip-on-wafer-on-substrate (CoWoS) package structure, and the electronic component 20' may include a chip-on-wafer (CoW) die. In some embodiments, the electronic component 20' includes an interposer 23, a semiconductor die 24, interconnection structures 25, electrical connectors 26, an underfill layer 27, and an encapsulant 28.

In some embodiments, the interposer 23 includes through vias, such as through substrate vias (TSVs) or the like, electrically connected to the interconnection structures 25 disposed over the top surface of the interposer 23 and the electrical connectors 26 disposed over the bottom surface of the interposer 23. The interposer 23 may include an organic interposer, a silicon interposer or the like. In some embodiments, the semiconductor die 24 is disposed over the top surface of the interposer 23, and electrically connected to the interposer 23 through the interconnection structures 25. The semiconductor die 24 may be an functional integrated circuit (IC) die as previously discussed. The interconnection structures 25 may include conductive pillars, solder balls, controlled collapse chip connection (C4) bumps, micro bumps, one or more other suitable bonding structures, or a combination thereof. In some embodiments, the electrical connectors 26 are disposed between and electrically connected to the substrate 10 and the interposer 23. The electrical connectors 26 may include conductive pillars, solder balls, controlled collapse chip connection (C4) bumps, micro bumps, one or more other suitable bonding structures, or a combination thereof. The materials and formation method of the interconnection structures 25, as well as the electrical connectors 26, may be the same or similar to those of the electrical connectors 21 illustrated in FIG. 2A. In some embodiments, the underfill layer 27 is disposed between the substrate 10 and the interposer 23, and encloses the electrical connectors 26. The materials and formation method of the underfill layer 27 may be the same or similar to those of the underfill layer 22 illustrated in FIG. 2A. In some embodiments, the encapsulant 28 encapsulates at least a portion of the interposer 23 and the semiconductor die 24. The encapsulant 28 may be made of or includes an insulating material such as a molding material. The molding material may include a polymer material, such as an epoxy-based resin with fillers dispersed therein. In some embodiments, a molding material (such as a liquid molding material) is dispensed onto the top surface of the interposer 23 and/or the semiconductor die 24. In some embodiments, a thermal process is then used to cure the liquid molding material and to transform it into the encapsulant 28. In some embodiments, a planarization process (e.g., chemical mechanical polishing (CMP) process) is also applied on the encapsulant 28 to partially remove the encapsulant 28, to expose the top surface of the semiconductor die 24 as depicted in FIG. 9.

Figure 10:
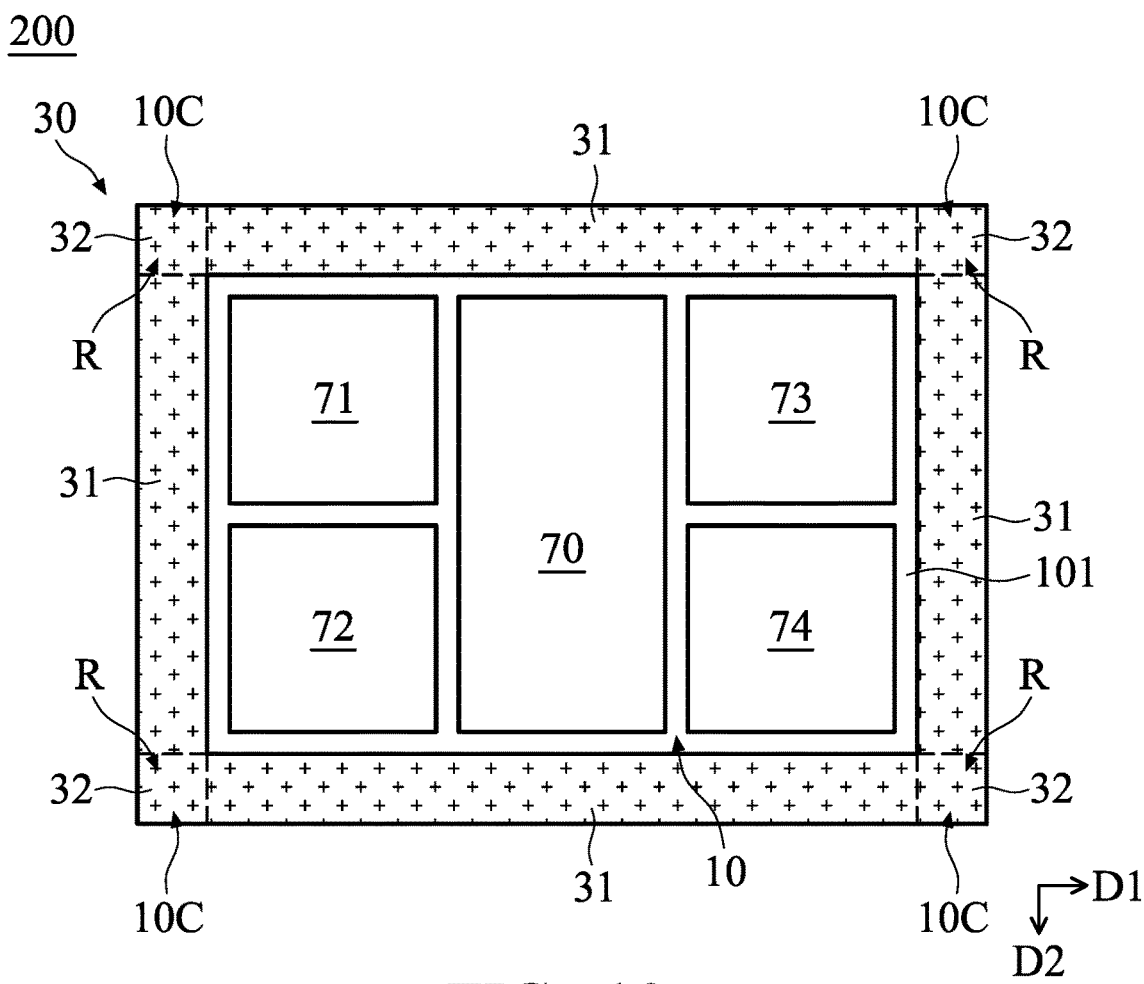
FIG. 10 is a schematic top view of a semiconductor device package, in accordance with some embodiments.

Although there are only one electronic component in the semiconductor device packages of the above embodiments, more than one electronic component or semiconductor device can also be used in other embodiments. For example, FIG. 10 illustrates a schematic top view of a semiconductor device package 200, in accordance with some embodiments. The semiconductor device package 200 is a multi-chip module (MCM) which includes at least two different functional dies integrated over the substrate 10. For example, in the embodiments shown in FIG. 10, the functional dies in the package include a first type of semiconductor die 70 and a second type of semiconductor dies 71 to 74. The semiconductor die 70 may be a system-on chip (SoC) die like the electronic component 20 previously discussed. In some other embodiments, the semiconductor die 70 is a system on integrated circuit (SoIC) device that includes two or more chips with integrated functions. Each of the semiconductor dies 71 to 74 may be a memory die, which may include a static random access memory (SRAM) device, a dynamic random access memory (DRAM) device, a high bandwidth memory (HBM) device, or another type of memory device. The semiconductor device package 200 may be a chip-on-wafer-on-substrate (CoWoS) package (e.g., the semiconductor dies 70-74 are attached to the substrate 10 via an interposer) or another suitable package. The semiconductor device package 200 may also include a ring structure 30 with only thinner corner parts 32, as discussed above, to control warpage.

Embodiments of the disclosure form a semiconductor device package including a substrate, at least one electronic component over the substrate, a ring structure over the substrate and surrounding the electronic component(s), and an adhesive layer interposed between the ring structure and the substrate. The ring structure of the disclosure helps to achieve better warpage control, for example, to reduce package warpage and also lower the stress concentrated at the corners of the substrate (induced by constraints of the ring structure on the substrate) by making the corner parts of the ring structure thinner than other parts of the ring structure to reduce coupling effect and CTE mismatch between the corner parts of the ring structure and the corners of the substrate. As a result, the semiconductor device package may be more reliably used and/or more reliably connected to an external electronic device (e.g., a PCB).

In accordance with some embodiments, a semiconductor device package is provided. The semiconductor device package includes a substrate, an electronic component, a ring structure, and an adhesive layer. The electronic component is located over a first surface of the substrate. The ring structure is located over the first surface of the substrate and surrounding the electronic component. The ring structure has a bottom surface facing the first surface of the substrate and a top surface opposite the bottom surface. The ring structure includes a plurality of recesses recessed from and located on the top surface, wherein the recesses are arranged corresponding to the corners of the substrate. The adhesive layer is interposed between the bottom surface of the ring structure and the first surface of the substrate.

In accordance with some embodiments, a semiconductor device package is provided. The semiconductor device package includes a substrate, an electronic component, a ring structure, and a first adhesive layer. The electronic component is located over a first surface of the substrate. The ring structure is located over the first surface of the substrate and surrounding the electronic component. The ring structure has a bottom surface facing the first surface of the substrate and a top surface opposite the bottom surface. The ring structure includes a plurality of side parts and a plurality of corner parts recessed from the top surface and thinner than the side parts. Any two of the corner parts are separated from one another by one of the side parts. A recess is formed between the top surface of each corner part and the lateral surface of the side part adjacent and connected to the top surface of the corner part, and the recesses are located on the top surface of the ring structure. The first adhesive layer is interposed between the bottom surface of the ring structure and the first surface of the substrate.

In accordance with some embodiments, a method for forming a semiconductor device package is provided. The method includes attaching an electronic component to a surface of a substrate. The method further includes applying an adhesive layer to the periphery of the surface of the substrate. In addition, the method includes mounting a ring structure on the periphery of the surface of the substrate via the adhesive layer. The ring structure has a bottom surface facing the surface of the substrate and a top surface opposite the bottom surface. The ring structure includes a plurality of recesses recessed from and located on the top surface, wherein the recesses are arranged corresponding to the corners of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package, comprising:
   a substrate having a first surface;
   an electronic component over the first surface of the substrate;
   a ring structure over the first surface of the substrate and surrounding the electronic component, wherein the ring structure comprises a metal material and is spaced from the electronic component, wherein the ring structure has a bottom surface facing the first surface of the substrate and a top surface opposite the bottom surface, and the ring structure includes a plurality of recesses recessed from and located on the top surface, wherein the recesses are arranged corresponding to corners of the substrate, wherein the ring structure has an outer edge that is substantially rectangular, and the recesses are located inside the outer edge in a top view; and
   a first adhesive layer interposed between the bottom surface of the ring structure and the first surface of the substrate.

2. The semiconductor device package as claimed in claim 1, wherein the substrate has a rectangular shape, and the corners of the substrate include four corners,
   wherein the plurality of recesses include four recesses corresponding to the four corners of the substrate, respectively.

3. The semiconductor device package as claimed in claim 1, wherein the outer edge of the ring structure is substantially aligned with an edge of the substrate, and an inner edge of the ring structure is separated from the electronic component.

4. The semiconductor device package as claimed in claim 1, wherein each of the recesses is immediately adjacent to the outer edge of the ring structure.

5. The semiconductor device package as claimed in claim 1, wherein each of the recesses is separated from the outer edge of the ring structure.

6. The semiconductor device package as claimed in claim 1, wherein each of the recesses is square, rectangular, triangular, circular, quarter circle shaped, or L-shaped in the top view.

7. The semiconductor device package as claimed in claim 1, further comprising a lid structure over the top surface of the ring structure and a second adhesive layer interposed between the ring structure and the lid structure, wherein a portion of the second adhesive layer extends into and directly contacts the recesses, wherein the top surface of the ring structure is separated from the lid structure through the second adhesive layer.

8. The semiconductor device package as claimed in claim 1, wherein the entire bottom surface of the ring structure is flat and does not have any recesses.

9. A semiconductor device package, comprising:
   a substrate having a first surface;
   an electronic component over the first surface of the substrate;
   a ring structure over the first surface of the substrate and surrounding the electronic component, wherein the ring structure comprises a metal material and is spaced from the electronic component, wherein the ring structure has a bottom surface facing the first surface of the substrate and a top surface opposite the bottom surface, and the ring structure includes a plurality of side parts and a plurality of corner parts recessed from the top surface and thinner than the side parts, wherein any two of the corner parts are separated from one another by one of the side parts, wherein a recess is formed between a top surface of each of the corner parts and a lateral surface of one of the side parts adjacent and connected to the top surface of the corner part, and the recesses are located on the top surface of the ring structure wherein the ring structure has an outer edge that is substantially rectangular, and the recesses are located inside the outer edge in a top view; and
   a first adhesive layer interposed between the bottom surface of the ring structure and the first surface of the substrate.

10. The semiconductor device package as claimed in claim 9, wherein the substrate has a rectangular shape and four corners,
    wherein the corner parts of the ring structure correspond to the four corners of the substrate, respectively, and each of the corner parts has a rectangular shape.

11. The semiconductor device package as claimed in claim 9, wherein the outer edge of the ring structure is substantially aligned with an edge of the substrate, wherein in the top view, the plurality of side parts and the plurality of corner parts are aligned with the edge of the substrate, and the recesses overlap the plurality of corner parts respectively.

12. The semiconductor device package as claimed in claim 9, wherein shapes of the recesses matches shapes of the corner parts.

13. The semiconductor device package as claimed in claim 9, wherein one of the side parts and one of the corner parts adjacent to the side part form a stepped profile.

14. The semiconductor device package as claimed in claim 9, wherein the ring structure further includes at least one strengthening part extending between opposite side parts of the plurality of side parts.

15. The semiconductor device package as claimed in claim 9, wherein the ring structure further includes at least one strengthening part protruding from at least one of the side parts.

16. The semiconductor device package as claimed in claim 9, further comprising:
    a lid structure over the top surface of the ring structure and a second adhesive layer interposed between the ring structure and the lid structure, wherein a portion of the second adhesive layer extends into and directly contacts the recesses, wherein the top surface of the ring structure is separated from the lid structure through the second adhesive layer.

17. A method for forming a semiconductor device package, comprising:

attaching an electronic component to a surface of a substrate;

applying an adhesive layer to a periphery of the surface of the substrate; and mounting a ring structure on the periphery of the surface of the substrate via the adhesive layer, wherein the ring structure comprises a metal material and is spaced from the electronic component, wherein the ring structure has a bottom surface facing the surface of the substrate and a top surface opposite the bottom surface, and the ring structure includes a plurality of recesses recessed from and located on the top surface, wherein the recesses are arranged corresponding to corners of the substrate, wherein the ring structure has an outer edge that is substantially rectangular, and the recesses are located inside the outer edge in a top view.

18. The method as claimed in claim 17, wherein the recesses of the ring structure are formed using a punching process.

19. The method as claimed in claim 17, wherein each of the recesses is immediately adjacent to the outer edge of the ring structure.

20. The method as claimed in claim 17, wherein each of the recesses is separated from the outer edge of the ring structure.

* * * * *